(12) United States Patent
Kim

(10) Patent No.: US 10,158,041 B2
(45) Date of Patent: Dec. 18, 2018

(54) UNIT PIXEL OF IMAGE SENSOR AND PHOTO DETECTOR USING THE SAME

(71) Applicant: Hoon Kim, Singapore (SG)

(72) Inventor: Hoon Kim, Singapore (SG)

(73) Assignee: Hoon Kim (KR)

( * ) Notice: Subject to any disclaimer, the term of this patent is extended or adjusted under 35 U.S.C. 154(b) by 446 days.

(21) Appl. No.: 14/327,549

(22) Filed: Jul. 9, 2014

(65) Prior Publication Data

US 2016/0013352 A1    Jan. 14, 2016

(51) Int. Cl.
  *H01L 27/00* (2006.01)
  *H01L 31/113* (2006.01)
  *H01L 27/146* (2006.01)

(52) U.S. Cl.
  CPC ...... *H01L 31/1136* (2013.01); *H01L 27/1461* (2013.01); *H01L 27/14612* (2013.01); *H01L 27/14643* (2013.01)

(58) Field of Classification Search
  CPC .............. H01L 27/1461; H01L 31/1136; H01L 27/14643; H01L 27/14612; H01L 27/142; H01L 31/053
  See application file for complete search history.

(56) References Cited

U.S. PATENT DOCUMENTS

| 4,197,469 A * | 4/1980 | Cheung | G11C 19/285 |
| | | | 250/338.4 |
| 7,994,465 B1 * | 8/2011 | Bamji | G01S 7/4816 |
| | | | 250/214 R |
| 8,569,806 B2 | 10/2013 | Kim | |
| 8,669,598 B2 | 3/2014 | Kim | |
| 8,669,599 B2 | 3/2014 | Kim | |
| 2004/0135207 A1 * | 7/2004 | Dosluoglu | H01L 27/14609 |
| | | | 257/365 |

(Continued)

FOREIGN PATENT DOCUMENTS

| JP | H11312798 A | 11/1999 |
| JP | 2004221586 A | 8/2004 |
| JP | 2011243704 A | 12/2011 |

(Continued)

*Primary Examiner* — Mounir Amer
*Assistant Examiner* — Alexander Belousov
(74) *Attorney, Agent, or Firm* — Renaissance IP Law Group LLP

(57) ABSTRACT

Disclosed are a photo detector capable of adjusting sensitivity and a unit pixel of an image sensor using the photo detector. The photo detector includes a light-absorbing part that absorbs light; a source and a drain that are separated from the light-absorbing part by an oxide film; a channel that is formed between the source and the drain to generate a flow of electric current between the source and the drain; and a sensitivity adjustment terminal that applies a voltage to the light-absorbing part, in which the light-absorbing part is doped with a first type impurities, the source and the drain are doped with a second type impurities, the flow of electric current in the channel is adjusted based on a change in a quantity of electric charges of the light-absorbing part according to tunneling of an electron excited by the light incident to the light-absorbing part to the source or the drain, and the voltage applied through the sensitivity adjustment terminal is adjusted to adjust a threshold voltage of the channel.

13 Claims, 7 Drawing Sheets

(56) References Cited

U.S. PATENT DOCUMENTS

2013/0056708 A1\*  3/2013  Kim .................. H01L 27/14612
                                                257/30

FOREIGN PATENT DOCUMENTS

| KR | 100558527    | 3/2006 |
|----|--------------|--------|
| KR | 20090043737 A| 5/2009 |
| KR | 101377648    | 3/2014 |
| TW | 201316501 A  | 4/2013 |
| WO | 2013032215 A | 3/2013 |

\* cited by examiner

UNIT PIXEL OF IMAGE SENSOR AND PHOTO DETECTOR USING THE SAME

BACKGROUND

1. Field of the Invention

Embodiments discussed herein relate to a unit pixel of an image sensor and a photo detector of the unit pixel, and particularly, to a unit pixel of an image sensor and a photo detector using the unit pixel capable of adjusting a light detection sensitivity of a light-absorbing part by adjusting a voltage applied to a gate functioning as the light-absorbing part.

2. Description of the Related Art

An image sensor is configured to convert an optical signal to an electrical image signal. When light is irradiated to a light-absorbing part in a unit pixel of an image sensor, the image sensor detects the light incident to each unit pixel and the amount thereof, converts an optical signal to generate an electrical signal to, and transmits the electrical signal to an analog and digital circuit so as to form an image.

When light is incident to the light-absorbing part of the unit pixel of the image sensor, one electron-hole pair (EHP) is generated for one incident photon, and the generated electrons and holes are accumulated in a photo diode, which is the light-absorbing part.

The maximum accumulation electrostatic capacity of the photo diode is proportional to a photo detection area of the photo diode. Particularly, in the case of a complementary metal oxide semiconductor (CMOS) type image sensor, the area in which the accompanying transistors are arranged is relatively larger than that of a charge coupled device (CCD) type image sensor and thus, there is a physical limit on increasing the photo detection area. Moreover, the photo diode, which is commonly used as the light-absorbing part of the image sensor, has relatively small electrostatic capacity and thus, the photo diode is easily saturated with a small amount of light so that it is difficult to segment the signals in an analogue form.

Accordingly, the unit pixel of the CMOS image sensor requires a relatively long photoelectric charge accumulation time in order to generate a minimum electric charge for signal processing through the limited photo detection area. Therefore, it may not be easy to manufacture a high-density/high-speed frame image sensor by using the unit pixel having such a light-absorbing part.

In order to overcome such limits in the conventional image sensor, U.S. Pat. No. 8,569,806 B2 ("UNIT PIXEL OF IMAGE SENSOR AND PHOTO DETECTOR THEREOF"), published on Sep. 2, 2011 by the applicant of the present application, discloses an unit pixel of an image sensor that changes a threshold voltage of a channel using tunneling of electric charge from a floating gate to a source electrode or a drain electrode. The specification of the present application incorporates the techniques disclosed in the entire specification of U.S. Pat. No. 8,569,806 B2 by reference.

However, in a photo detector of U.S. Pat. No. 8,569,806 B2, a threshold voltage for photoelectric conversion is determined depending on a concentration and polarity of an ion doped on a floating gate and a well for device isolation in the initial manufacturing process and accordingly, a sensitivity value of the image sensor is also determined depending on the concentration and polarity of the ion doped during manufacturing processes.

Eventually, in U.S. Pat. No. 8,569,806 B2, magnitudes and sensitivity values of a photoelectric current and a dark electric current in the unit pixel are mainly determined depending on a predetermined doping concentration of the floating gate in the manufacturing processes and thus, there is a problem in that a repetitive manufacturing procedure needs to be performed several times until an optimal threshold voltage condition suitable for the required specifications is satisfied.

SUMMARY

The present invention is contrived to solve the problems of the related art as described above, it is desired to provide a unit pixel of an image sensor capable of adjusting a light detection sensitivity of a photo detector by applying a voltage to a gate which operates as a light-absorbing part to adjust a threshold voltage of a channel.

In addition, it is desired to provide a unit pixel of an image sensor capable of serving functions such as auto exposure and electric shutter.

According to an embodiment of the present invention, it is possible to obtain an optimized optical response characteristic by adjusting a threshold voltage of a photo detector of an image sensor by applying an external electric field, instead of using a doping concentration through ion implantation.

Further, it is possible to adjust the sensitivity characteristic of the photo detector on a circuit by adjusting the applied voltage, and reduce the dependence on process with respect to characteristic values of devices such as a light detection sensitivity of the photo detector.

Further, it is possible to implement a photo detector having a significantly great high-sensitivity characteristic for the same amount of light compared to a photo diode, thereby manufacturing an image sensor capable of shooting a high-speed video even in an environment of low-level illumination.

Further, it is possible to adjust a magnitude of photoelectric current according to the amount of incident light by adjusting the applied voltage, thereby serving a function of auto exposure adjustment in each pixel unit, which has been separately performed on an existing analog circuit.

Further, it is possible to reset each pixel by applying a reset voltage to a sensitivity value adjustment gate, and to implement the electric shutter function without using an additional transistor.

DETAILED DESCRIPTION

The present invention may be applied with various modification and have a kinds of embodiments, and thus, hereinafter, certain embodiments will be illustrated in the accompanying drawings and be described in detail. However, it is not intended to restrict the present invention to certain embodiments, and shall be construed as including all modifications, equivalents and substitutes covered by the ideas and technical scope of the present invention.

Throughout the description of the present invention, when specifically describing a related known technology is determined to evade the point of the present invention, the pertinent detailed description will be omitted. Further, terms of the specification, such as "first" and "second," used in describing various elements are mere reference signs to distinguish one component from the other.

Further, in the specification, when one component is described as being "connected" or "gaining access" to another component, it shall be construed as that the one component may be directly connected or gain access to the other component, but also connected or gain access to the other component with further another component interposed there between.

Suffixes "module" and "part" with respect to components used in the description below are given, or added and used in consideration of convenience in creating the specification and thus, do not contain meanings or roles to be distinguished from each other unless otherwise mentioned.

Hereinafter, a unit pixel of an image sensor of the present invention having functions of sensitivity adjustment, auto exposure, and electric shutter, and a photo detector of the unit pixel will be described with reference to the accompanying drawings.

Figure 1:
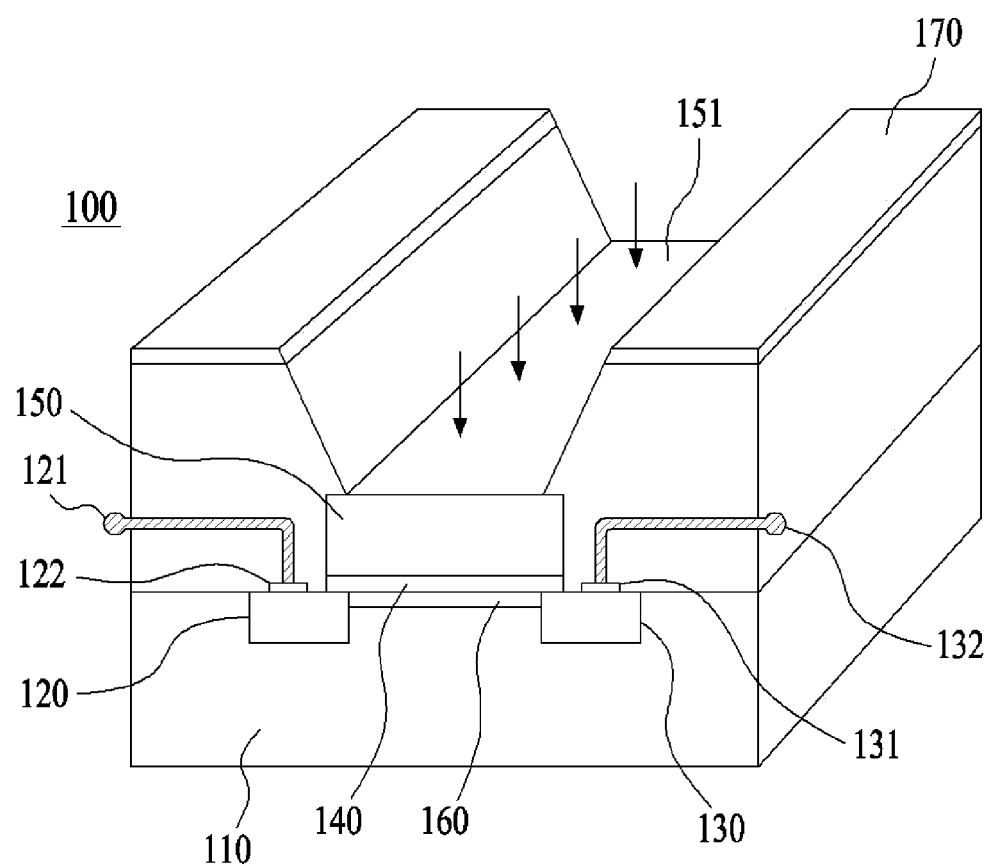
FIG. 1 is a perspective view of a photo detector according to an embodiment of the present invention.

[FIG. 1—Structure of Photo Detector]

FIG. 1 illustrates a photo detector configuring a unit pixel of an image sensor according to an embodiment of the present invention.

Referring to FIG. 1, the photo detector of the unit pixel is realized using a tunnel junction device, in lieu of a conventional photo diode. The tunnel junction device has a structure in which a thin insulation layer is joined between two conductors or semiconductors, and refers to a device that operates using a tunneling effect generated in the insulation layer.

A photo detector 100 may be realized using, for example, a general n-metal oxide silicon field effect transistor (MOSFET). In this case, the photo detector 100 is formed on a p-type substrate 110 and includes an N+ diffusion layer 120 corresponding to a source and an N+ diffusion layer 130 corresponding to a drain in a general NMOS electronic device. Hereinafter, the N+ diffusion layers 120 and 130 will be referred to as the "source" and the "drain" in the photo detector, respectively.

Metal contacts 121 and 131 are formed on the top of the source 120 and the drain 130 to be connected to external nodes. The metal contacts 121 and 131 are connected to an outside through metal lines 122 and 132, respectively.

A thin oxide film 140 is formed between the source 120 and the drain 130. A poly-silicon 150, in which p-type impurities are doped, corresponding to the gate in a general n-channel metal oxide semiconductor (NMOS) structure, is formed on an upper part of the oxide film 140. The poly-silicon 150 operates as a light-absorbing part in the photo detector 100. Hereinafter, the poly-silicon 150 will be referred to as the "light-absorbing part".

The light-absorbing part 150 is separated from the source 120 and the drain 130 by the oxide film 140. A tunneling phenomenon occurs between the light-absorbing part 150 and the source 120 or the drain 130. Here, in order to facilitate the occurrence of the tunneling, it is preferable to form a thickness of the oxide film 140 to be 10 nm or less.

As different from the gate of the general MOSFET device, in the photo detector 100, a light-blocking layer 170 is formed on an upper part of an area other than the upper part 151 of the light-absorbing part 150.

Figure 2:
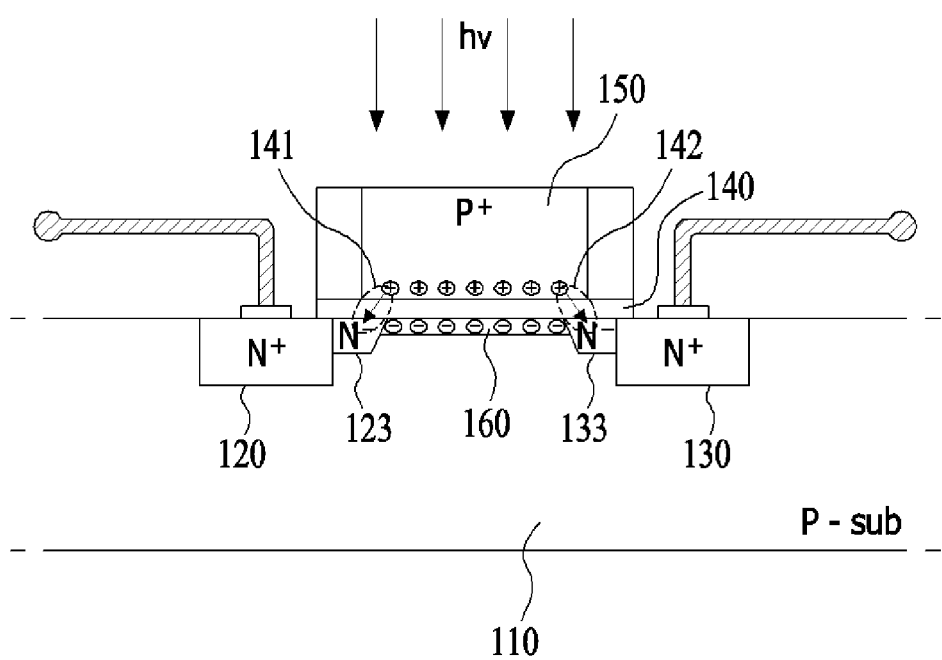
FIG. 2 is a cross-sectional view illustrating an operation principle of the photo detector of FIG. 1.

[FIG. 2—Operation Principle of Photo Detector]

FIG. 2 is a cross-sectional view illustrating the operation principle of the photo detector according to the first embodiment of the present invention.

Referring to FIG. 2, the photo detector 100 of the present invention absorbs light through the upper part of the light-absorbing part 150. A certain electric field is generated between the source 120 and the drain 130, and the light-absorbing part 150 by the incident light, and a channel 160 is formed between the source 120 and the drain 130 by the incident light. Specifically, an EHP is generated by the light incident to the light-absorbing part 150, the generated electron of the EHP is moved to the source 120 or the drain 130 by tunneling through the oxide film 140.

According to the loss of the electrons in the light-absorbing part 150, the quantity of electric charge in the holes of the light-absorbing part 150 relatively increases. Such a change in the quantity of electric charge causes a threshold voltage of the channel 160 to decrease so that an electric current flows in the channel.

Meanwhile, the photo detector 100 may be formed in a light doped drain (LDD) structure. When the photo detector 100 is realized through the LDD process, the generation of hot carriers due to a short channel effect may be reduced.

For example, in the NMOS-type photo detector 100, the photo detector 100 is formed on the p-type substrate 110, and includes the source 120 and the drain 130 formed of an n-type diffusion layer doped at high concentration. Between the source 120 and the drain 130, LDD areas 123 and 133 of the n-type diffusion layer, doped at a low concentration, are formed adjacently to the source 120 and the drain 130, respectively. The length of the light-absorbing part 150 may be formed to be longer than or equal to the length between the LDD area 123 of the source and the LDD area 133 of the drain.

When light having greater energy than binding energy of the doped impurities is irradiated to the light-absorbing part 150, EHPs are generated in the light-absorbing part 150 due to photo excitation, and the generated EHPs are present in the states of electrons and holes for a predetermined duration until being recombined.

The separated electrons freely move outside a grain boundary of the poly-silicon which is the light-absorbing part 150. Here, when a voltage is applied to the source 120 or the drain 130, the electrons are pulled to near an edge of the LDD areas 123 and 133 of the source or the drain. The pulled electrons are accumulated near the edge of the light-absorbing part 150 that is adjacent to the LDD areas 123 and 133 to form the electric field. As the number of integrated electrons increases, the electric field relatively much stronger is formed. Accordingly, the phenomenon of integration of electrons near the edge of the light-absorbing part 150 becomes further accelerated. The more intense the light irradiated to the light-absorbing part 150 is, the more electron-hole pairs are generated and the greater electric field is formed.

The tunneling phenomenon readily occurs at a boundary area 141 in which the distance between the LDD area 123 of the source and the light-absorbing part 150 is the shortest, and at a boundary area 142 in which the distance between the LDD area 133 and the light-absorbing part 150 is the shortest. A tunneling effect occurs at a moment when an energy level condition is satisfied in the boundary areas 141 and 142. By the tunneling effect, the electrons integrated in the boundary areas 141 and 142 of the light-absorbing part 150 are moved to the source 120 or the drain 130. Accordingly, there occurs an effect that a quantity of electric charge of the holes is increased by the number of electrons lost in such a way, and the change in the quantity of electric charge in the light-absorbing part 150 leads to an effect of lowering the threshold voltage of the channel, thereby the electric current flows to the channel 160 of the photo detector 100 by the light incident to the light-absorbing part 150.

The photo detector having such a structure may generate a flow of photoelectric current, which is hundreds to thousands times greater than a conventional photo diode, in relation to the same amount of light. Specifically, the photo diode distinguishes the brightness only by the quantity of electric charge accumulated in the electrostatic capacity. On the contrary, the change in the quantity of electric charge of the light-absorbing part 150 caused by the light actions as the electric field effect in the photo detector 100, thereby controlling the electric current flow of the channel. In addition, since the required electric charge is infinitely supplied through the drain, a signal can be self-amplified in the photo detector. Therefore, it is possible to realize a unit pixel in an image sensor without designing an additional signal amplification device, thereby achieving miniaturization.

Meanwhile, the photo detector 100 is manufactured by adjusting a doping concentration of the light-absorbing part 150 in the manufacturing process so that the channel 160 is in the state immediately before pinch-off while no external voltage is applied to the source 120 and the drain 130.

Here, in order to find an optimal threshold voltage condition, the photo detector 100 is experimentally manufactured in a repeated manner, considering not only the doping concentration of the light-absorbing part 150 but also other properties such as a width/length (W/L) ratio of the gate, a type of ion to be doped, a thickness of the oxide film, and a dielectric constant of the oxide film. Specifically, the doping concentration of the light-absorbing part 150 relates directly to displacement of surface potential of silicon (Si), which corresponds to the channel 160, and the threshold voltage is adjusted by the change in the gap between a Fermi level and an intrinsic level of the silicon interface due to the displacement of the surface potential.

In this case, when impurities are doped in the light-absorbing part 150 in the manufacturing process, a gap between the Fermi level and the intrinsic level may be excessively narrowed than a proper gap, or even overlapped, which may cause an excessive dark electric current to flow in the channel 160 even in the state where the light is not incident thereto.

Figure 3:
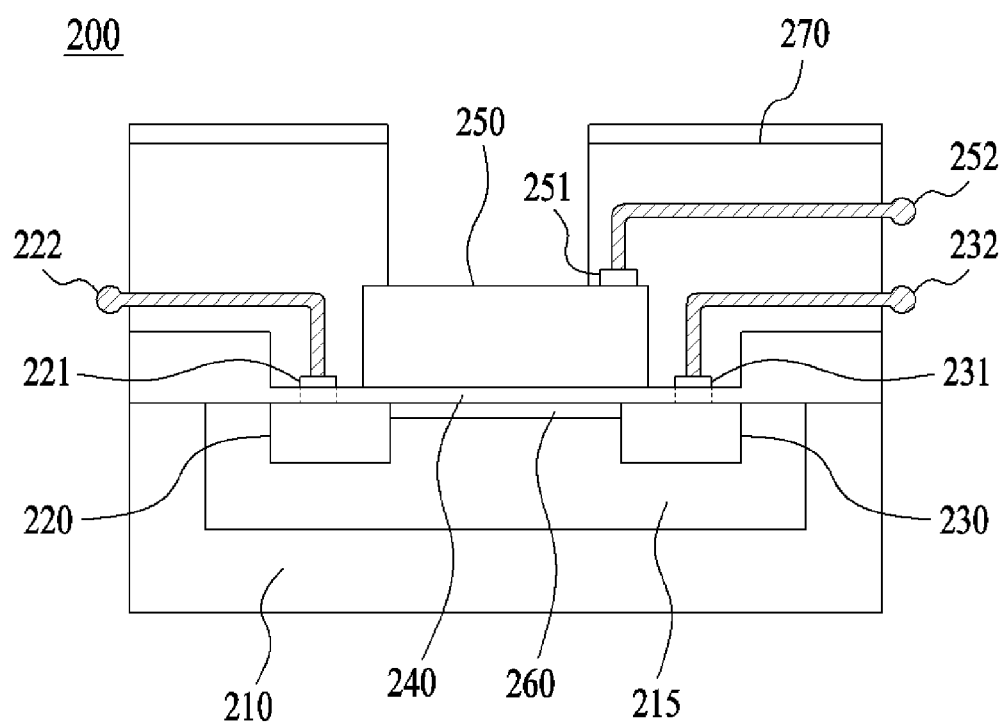
FIG. 3 is a diagram illustrating a structure of a sensitivity adjustment photo detector according to an embodiment of the present invention.

[FIG. 3—Structure of Sensitivity Adjustment Photo Detector]

FIG. 3 illustrates a sensitivity adjustment photo detector according to an embodiment of the present invention.

Referring to FIG. 3, a sensitivity adjustment photo detector 200, similarly to the photo detector 100, absorbs light through a light-absorbing part 250, adjusts a threshold voltage of a channel using a tunneling effect, and generates a photoelectric current flowing in the channel. Hereinafter, a case in which the sensitivity adjustment photo detector 200 is formed as a p-channel metal oxide semiconductor (PMOS) structure will be described as an example. It is matter of course that the sensitivity adjustment photo detector 200 may have an NMOS structure. The description identically applicable to the photo detector of FIG. 1 will be omitted here for brevity.

The sensitivity adjustment photo detector 200 is formed on a p-type substrate 210, and an N-well 215 is formed by injecting n-type impurities into the p-type substrate 210. Thereafter, a source 220 and a drain 230 are formed by injecting p-type impurities having high concentration on the formed N-well 215. On an upper part of the source 220 and the drain 230, a thin oxide film 240 is formed, and on an upper part of the oxide film 240, the light-absorbing part 250 is formed opposite to the source 220 and the drain 230 with the oxide film 240 interposed there between.

On the upper part of the source 220 and the drain 230, metal contacts 221 and 231 are formed so as to be connected to external nodes. The source 220 is connected to the outside via a metal line 222 connected to the metal contact 221. Similarly, the drain 230 is connected to the outside via a metal line 232 connected to the metal contact 231.

The N-well 215 is formed in a floated structure. As the N-well 215 is floated, it is possible to more readily detect a change in the quantity of electric charge in the light-absorbing part 250, which is generated by the incident light.

The light-absorbing part 250 is formed of the poly-silicon doped with n-type or p-type impurities. On one side of the light-absorbing part 250, a sensitivity adjustment terminal 252 is formed. The sensitivity adjustment terminal 252 is connected to the light-absorbing part 250 through a metal terminal 251 which is formed in an area in the light-absorbing part 250 to which the light is not incident. The photo detector 200 controls an external voltage applied through the sensitivity adjustment terminal 252 so as to adjust a threshold voltage of a channel 260.

A light-blocking layer 270 is formed on the upper part of the area other than the upper part of the light-absorbing part 250 in the photo detector 200. The light-blocking layer 270 is configured to block absorption of the light from in the area other than the light-absorbing part 250. Metallic impurities included in the light-blocking layer 270 makes the generation of the electron-pore pairs by light difficult, and reflects a considerable amount of the incident light so as to block the light from being absorbed in the area other than the light-absorbing part 250. The light-blocking layer 270 is configured to allow the photoelectric charges in the light-absorbing part 250, where the light is absorbed, to undergo tunneling effectively. In addition, the light-blocking layer 270 is configured to obtain a photoelectric current to be controlled while suppressing generation of parasitic charges other than the given channel 260. The light-blocking layer 270 may be formed through a metal or silicide process, and it is possible to exclude the formation of the light-blocking layer 270 on the upper part of the light-absorbing part 250 using a mask.

Figure 4:
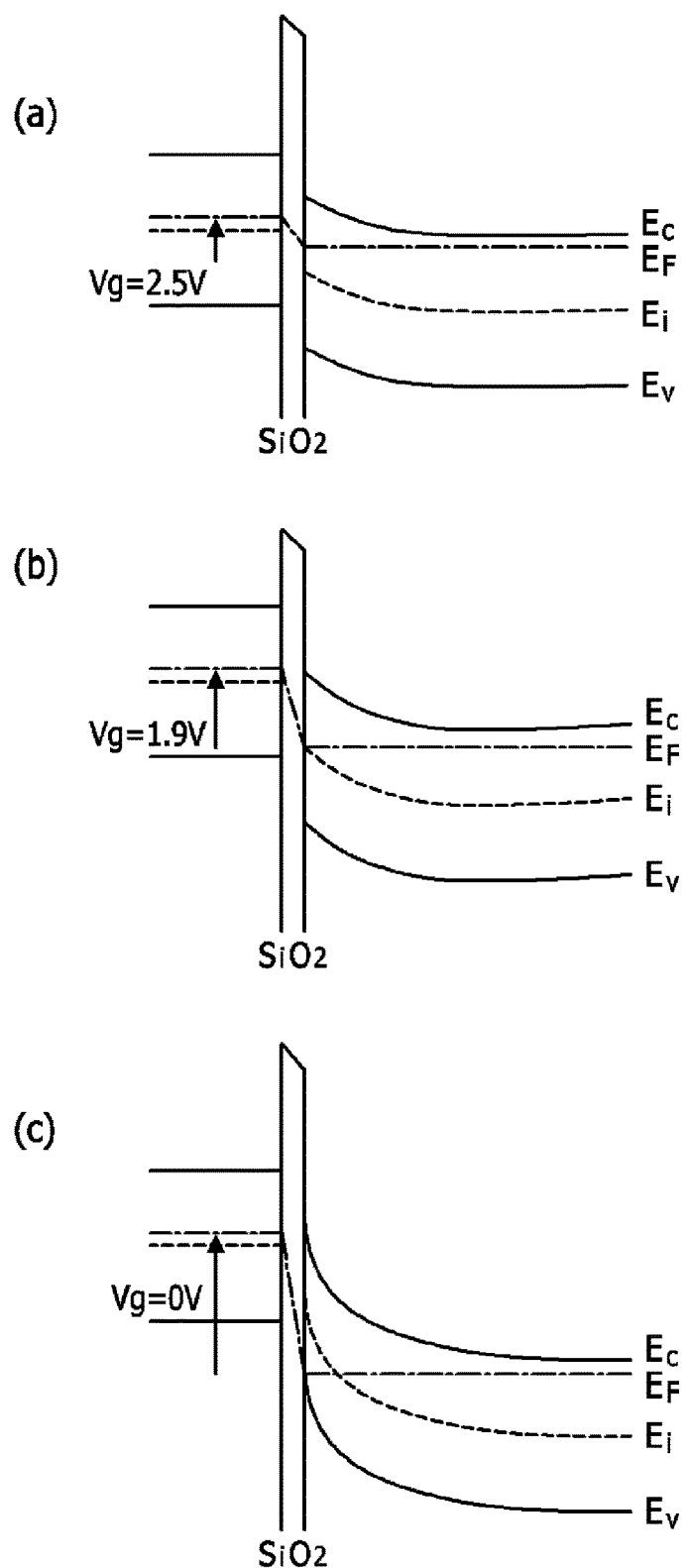
FIG. 4 is a diagram illustrating a sensitivity adjustment principle of the sensitivity adjustment photo detector of FIG. 3.
Figure 5:
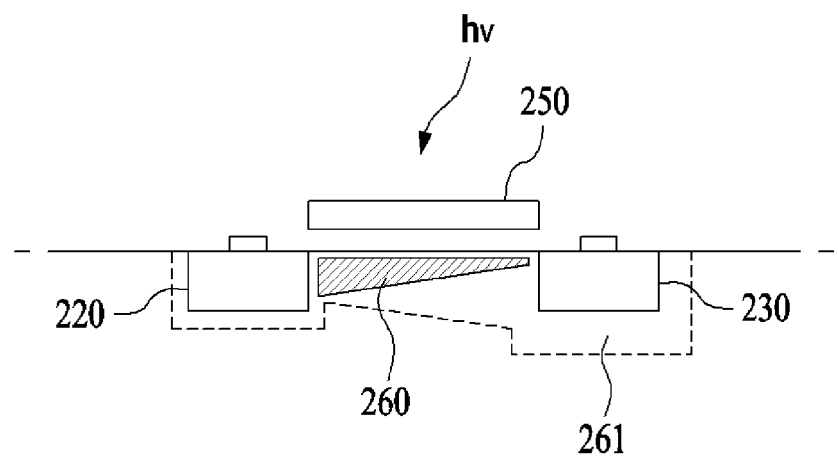
FIG. 5 is a diagram illustrating an operation process of the sensitivity adjustment photo detector of FIG. 3.

[FIGS. 4 and 5—Sensitivity Adjustment Principle]

FIG. 4 is a diagram illustrating a sensitivity adjustment principle of the sensitivity adjustment photo detector of FIG. 3, and FIG. 5 is a diagram illustrating the operation process of the sensitivity adjustment photo detector of FIG. 3. Hereinafter, a case where the sensitivity adjustment photo detector has the PMOS structure will be described as an example.

FIG. 4 illustrates an energy band diagram of the sensitivity adjustment photo detector 200 configured with the light-absorbing part 250, the oxide film 240, and a silicon channel 260. The sensitivity adjustment photo detector 200 applies an optional external voltage using the sensitivity adjustment terminal 252 connected to the light-absorbing part 250 so as to adjust the threshold voltage condition of the channel.

Referring to FIG. 4A, when an external voltage (Vg) higher than or equal to or a set voltage is applied (for example, in the case of the set voltage of 1.9V, when the external voltage of 2.5V is applied) to the light-absorbing part 250 through the sensitivity adjustment terminal 252, the potential state of the silicon interface, on which the PMOS channel may be formed, becomes a threshold voltage condition "$E_F > E_i$", which is greater than a pinch-off condition "$E_F = E_i$". Under the threshold voltage condition, an electric current does not flow in the channel 260, and the photo detector 200 enters a state of not operating as the photo detector regardless of irradiation of light, that is, a reset state. This is similar to the case of an intrinsic state in which impurities are not doped in the light-absorbing part 150 or a case in which n-type ions are slightly doped in the light-absorbing part 150, in the photo detector 100 provided with the light-absorbing part 150 as the floating gate in FIG. 1.

Meanwhile, as described above, when an external voltage higher than or equal to the set voltage is applied to the light-absorbing part 250 of all the unit pixel of the image sensor through the sensitivity adjustment terminal 252, all the unit pixels enter a reset state simultaneously with applying of the voltage. In this manner, it is possible to realize the electric shutter function without introducing an additional transistor device.

FIG. 4B illustrates an energy band diagram in a case where an external voltage equal to a set voltage (for example, 1.9V in FIG. 4B) is applied to the light-absorbing part 250 through the sensitivity adjustment terminal 252. In this case, a potential on the silicon interface becomes approximate to "$E_F = E_i$" and thus, the channel 260 becomes a state immediately before pinch-off. In addition, in this state, a photoelectric current does not flow in the channel 260 unless light is incident to the light-absorbing part 250. However, when even a little amount of light is incident to the light-absorbing part 250, light-excited electric charges undergo tunneling to the drain or the source, which lowers the threshold voltage, thereby allowing the photoelectric current to flow in the channel. This is similar to the case in which the photo detector 100 provided with the light-absorbing part 150 as the floating gate of FIG. 1 is designed by adjusting a doping concentration and a W/L ratio of p-type impurities in the light-absorbing part 150 so that the Fermi level and the intrinsic level are approximate to each other in the silicon interface. Meanwhile, dissimilar to the photo detector 100 of FIG. 1, the sensitivity adjustment photo detector 200 has a great difference in that it is not necessary to finely adjust a doping concentration, polarities of ions, or a W/L ratio in the manufacturing process in order to make the channel be in a state immediately before pinch-off, and it is possible to adjust the threshold voltage of the channel 260 by applying an appropriate external voltage through the sensitivity adjustment terminal 252. When a great amount of light is incident to the photo detector for a short period of time in a state to which the external voltage equal to the set voltage is applied, an excessive photoelectric current flows in the channel so that an image may be saturated. In order to prevent such a problem, an automatic exposure function may be realized in which the external voltage is applied to be quite higher than the set voltage (for example, quite higher than 1.9 V) in the case a great amount of light is suddenly incident thereto so as to prevent the image saturation in the photo detector in advance.

FIG. 4C illustrates an energy band diagram in the state where the light-absorbing part 250 is applied with an external voltage of 0V through the sensitivity adjustment terminal 252. In this case, in the silicon interface, the Fermi level and the intrinsic level are overlapped to form a hole accumulation region in potential, thereby entering a state where an electric current constantly flows in the channel. In this state, most of the current flowing in the channel is configured with a dark electric current. Accordingly, by setting the outside voltage, applied to the light-absorbing part 250 through the sensitivity adjustment terminal 252, it is possible to reduce the dark electric current component, and increase a signal electric current, thereby readily increasing the efficiency in light-absorption detection.

In this manner, an external voltage applied to the light-absorbing part 250 through the sensitivity adjustment terminal 252 needs to be set not only considering the light sensitivity performance but also the dark electric current component. Further, a magnitude of the external voltage applied through the sensitivity adjustment terminal 252 may be reduced by appropriately adjusting a concentration of impurities to be doped in the light-absorbing part 250, polarities of ions, a width/length ratio, and the like, which leads to a reduction in entire power consumption of the image sensor.

Referring to FIG. 5, the sensitivity adjustment photo detector 200 adjusts the threshold voltage of the channel 260 by adjusting an external voltage applied to the sensitivity adjustment terminal 252. When the threshold voltage of the channel 260 is adjusted, the channel 260 becomes in a state immediately before pinch-off, and a depletion layer 261 is formed around the source 220, the drain 230 and the channel 260.

When light is irradiated to the light-absorbing part 250 in the state immediately before pinch-off, the tunneling phenomenon consistently occurs near a boundary between the light-absorbing part 250 and the source 220, or a boundary between the light-absorbing part 250 and the drain 230. Here, as the intensity of light is greater, the tunneling on the drain 230 side actions more prominently, whereas, the tunneling on the source 220 side actions more prominently as the intensity of light is smaller, thereby maintaining the state of equilibrium.

Figure 6:
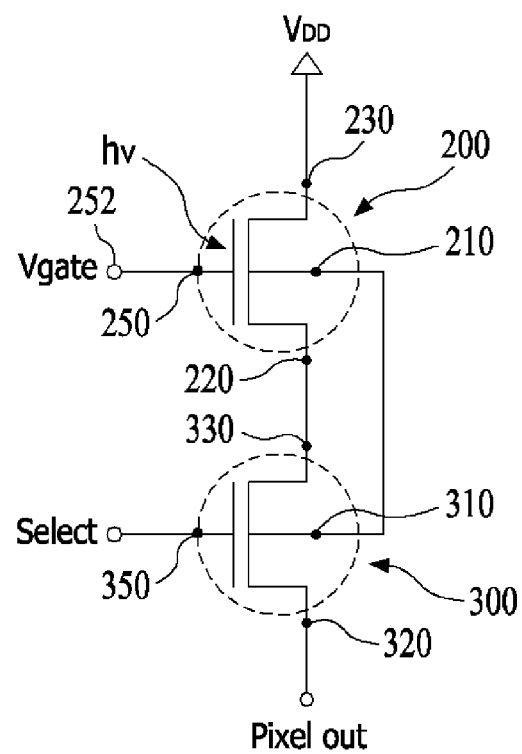
FIG. 6 is an example of a circuit diagram of a unit pixel using the sensitivity adjustment photo detector of FIG. 3.
Figure 7:
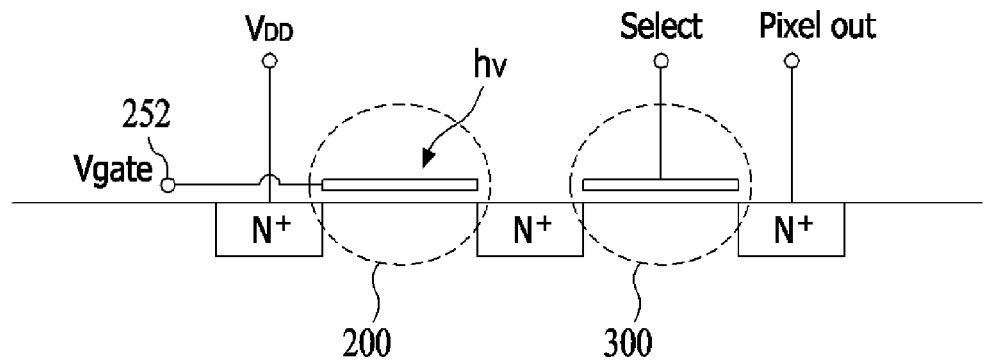
FIG. 7 is a cross-sectional view of the unit pixel using the sensitivity adjustment photo detector of FIG. 6.

[FIGS. 6 and 7—Embodiment of Unit Pixel]

Next, exemplary embodiments of a unit pixel of an image sensor which is realized using a sensitivity adjustment photo detector will be described with reference to the drawings.

FIG. 6 is an example of a circuit diagram of the unit pixel using the sensitivity adjustment photo detector of FIG. 3. The unit pixel illustrated in FIG. 6 includes one sensitivity adjustment photo detector 200 and one select device 300.

Here, the select device may be realized with various devices. For example, the select device may be realized using a conventional MOSFET structure. In this case, it is possible to simultaneously realize the sensitivity adjustment photo detector 200 and the select device 300 through a single MOSFET manufacturing process and thus, the manufacturing cost can be reduced and the manufacturing process can be simplified.

The drain 230 of the sensitivity adjustment photo detector 200 is connected to a power supply voltage (VDD), and the source 220 is connected to a drain 330 of the select device 300. The upper part of the light-absorbing part 250 of the sensitivity adjustment photo detector 200 is opened so as to allow light to be incident thereto. The sensitivity adjustment terminal 252 for applying an external voltage is connected to an area in which the light-absorbing part 250 is not opened.

A body 210 of the sensitivity adjustment photo detector 200 and a body 310 of the select device 300 may be formed in the floated structure. In this case, in the gate control of the select device 300 that is operated by a switch, a switching function can be maintained by applying a slightly higher voltage than the power supply voltage (VDD).

The source 320 of the select device 300 is connected to a pixel output terminal of the unit pixel and switch-controls the output of the sensitivity adjustment photo detector 200. A control signal for on-off control of the select device 300 is supplied from the gate 350.

The unit pixels are disposed in an array form and constitute the image sensor. Here, it is possible to drive the image sensor as a sensor having different sensitivity values by applying different voltages to the sensitivity adjustment terminal for each unit pixel. In addition, through the sensitivity adjustment for each unit pixel, the disuniformity of properties for each unit pixel may be adjusted in a circuit so as to ensure the uniformity of the image sensor.

FIG. 7 is a cross-sectional view of the unit pixel configured with the sensitivity adjustment photo detector 200 and the select device 300 of FIG. 6.

As illustrated in FIG. 7, both of the sensitivity adjustment photo detector 200 and the select device 300 may be realized in a floated structure using the same substrate as the body. In this case, the source 210 of the sensitivity adjustment photo detector 200 and the drain 330 of the select device 300 can be formed on the same active area so that the structure of the unit pixel is simple and the size of the unit pixel is reduced.

Figure 8:
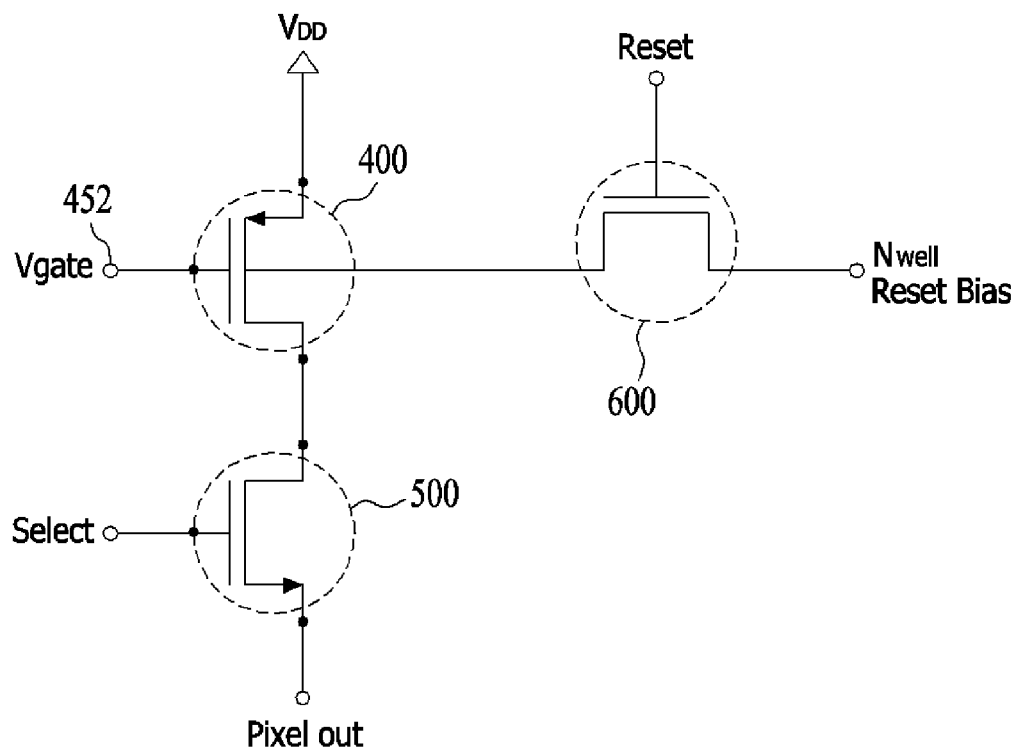
FIG. 8 is another example of the circuit diagram of the unit pixel using the sensitivity adjustment photo detector of FIG. 3.
Figure 9:
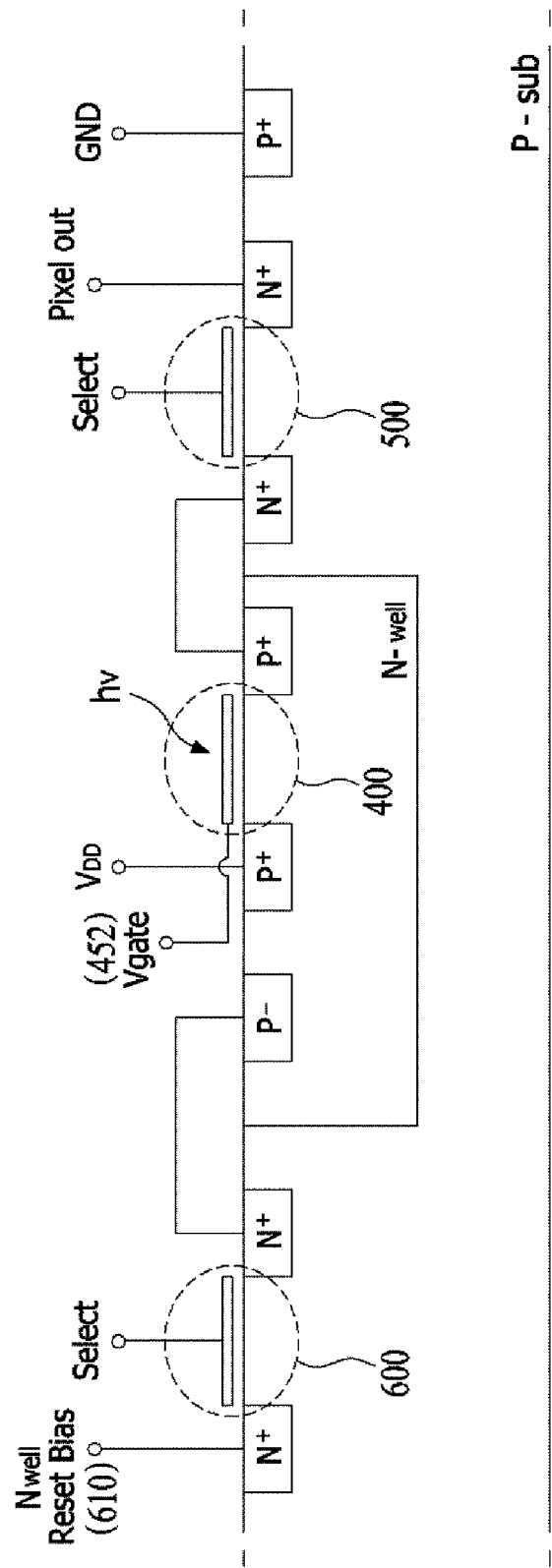
FIG. 9 is a cross-sectional view of the unit pixel using the sensitivity adjustment photo detector of FIG. 8.

[FIGS. 8 and 9—Another Embodiment of Unit Pixel]

FIG. 8 illustrates another example of the circuit diagram of the unit pixel using the sensitivity adjustment photo detector of FIG. 3. The unit pixel illustrated in FIG. 8 includes one sensitivity adjustment photo detector 400, one select device 500, and one reset device 600.

Similar to the sensitivity adjustment photo detector 400 and the select device 500, the reset device 600 may be realized in the MOSFET structure. Accordingly, it is possible to realize the sensitivity adjustment photo detector 400, the select device 500, and the reset device 600 included in a single unit pixel through a single MOSFET manufacturing process and thus, the manufacturing cost can be reduced and the manufacturing process can be simplified.

The drain of the sensitivity adjustment photo detector 400 is connected to the power supply voltage (VDD), the source is connected to the drain of the select device 500, and the source of the select device 500 is connected to the pixel output terminal of the unit pixel.

The drain of the reset device 600 is connected to the N-well body of the sensitivity adjustment photo detector 400, and a bias voltage for reset is applied to the source of the reset device 600. The N-well operates as a device isolation well that isolates adjacent devices.

In an unselect state, that is, in a state where the select device 500 is in the off-state, the unit pixel is reset by the reset device 600. Specifically, when a bias voltage is applied to the source of the reset device 600, a certain voltage is applied to the N-well of the sensitivity adjustment photo detector 400, which is connected to the drain of the reset device 600, remaining electric charges of N-well are eliminated to initialize the sensitivity adjustment photo detector 400.

When the initialization process of the reset device 600 ends, the select device 500 is activated to operate the sensitivity adjustment photo detector 400. Since all remaining electric charges in the floated N-well are eliminated before operating the sensitivity adjustment photo detector 400, it is possible to suppress generation of dark electric current due to the remaining electric charges.

While the N-well is connected to the drain of the reset device 600, subsequent to the completion of the reset operation, in other words, in a state where the select device 500 is in the on-state and the sensitivity adjustment photo detector 400 is in operation, the photoelectric current is not lost since such a state is identical to the state where the N-well is floated.

FIG. 9 is a cross-sectional view of the unit pixel configured with the sensitivity adjustment photo detector 400, the select device 500, and the reset device 600 of FIG. 8.

As illustrated in FIG. 9, the sensitivity adjustment photo detector 400, the select device 500 and the reset device 600 are all realized directly on the same substrate or by forming an N-well, and the N-well is maintained in a floated state during the operation process of the sensitivity adjustment photo detector 400 as described in the foregoing. In this case, the unit pixel is configured only with the sensitivity adjustment photo detector 400 having the MOSFET structure, the select device 500, and the reset device 600 and thus, the structure may be simple. Further, it is possible to realize the unit pixel at a time through a single MOSFET manufacturing process, thereby simplifying manufacturing process.

The foregoing description has been provided to describe the technical ideas of the present invention in illustrative purposes only, and it shall be appreciated that it is possible for a person with an ordinary skill in the art to which the present invention pertains to derive various alterations or modifications without departing the essential features of the present invention.

Therefore, the embodiments disclosed in the present invention are not intended to restrict the technical ideas of the present invention but to illustrate and accordingly, the scope of the technical ideas of the present invention is not defined by such embodiments.

The protection scope of the present invention shall be defined by the claims appended below, and it shall be understood that all possible technical ideas included in the equivalent scope of the claims are included in the scope of the claims of the present invention.

What is claimed is:

1. A sensitivity adjustment photo detector, comprising:
 a light-absorbing part configured to absorb light;
 a source and a drain that are separated from the light-absorbing part by an oxide film;
 a channel that is formed between the source and the drain and configured to generate a flow of electric current between the source and the drain; and
 a sensitivity adjustment terminal configured to apply an external voltage to the light-absorbing part and a P-well or N-well of the sensitivity adjustment terminal is connected to a drain of a reset device,
 wherein the light-absorbing part is doped with first type impurities, and the source and the drain are doped with second type impurities,
 wherein the flow of electric current in the channel is adjusted based on a change in a quantity of electric charges in the light-absorbing part according to tunneling of electrons excited by light incident to the light-absorbing part to the source or the drain, and wherein the channel is configured to have a threshold voltage adjusted by controlling the external voltage, wherein when the external voltage is adjusted, a gap between a Fermi level and an intrinsic level of the channel is adjusted, and the threshold voltage is adjusted, wherein, when an absolute value of the external voltage is adjusted to be higher than the absolute value of a set voltage, the light-absorbing part has a first potential state and no current flows through the channel, wherein, when the absolute value of the external voltage is adjusted to be equal to the absolute value of the set voltage, the light-absorbing part has a second potential state, and when the light is incident on the light-absorbing part, the current flows through the channel, wherein, when the absolute value of the external voltage is adjusted to be 0V to reduce dark electric current, the light-absorbing part has a third potential state and the current always flows through the channel, and wherein a value of set voltage when light is suddenly incident to the light-absorbing part is higher than the value of the set voltage so as to prevent the image saturation in the sensitivity adjustment photo detector in advance, and wherein the drain of the reset device is connected to a P-well or N-well body of the sensitivity adjustment photo detector, and a bias voltage for reset is applied to a source of the reset device, and where all remaining electric charges in the floated N-well are eliminated before operating the sensitivity adjustment photo detector to suppress generation of dark electric current due to the remaining electric charges.

2. The sensitivity adjustment photo detector according to claim 1, wherein the source and the drain are formed on a well doped with the first type impurities, and wherein the well is in a flattened state.

3. The sensitivity adjustment photo detector according to claim 1, wherein the sensitivity adjustment terminal is configured to adjust a magnitude of the external voltage applied to the light-absorbing part so as to adjust a sensitivity of the light-absorbing part.

4. The sensitivity adjustment photo detector according to claim 1, wherein the tunneling occurs in a region between any one of the source and the drain, and the light-absorbing part.

5. The sensitivity adjustment photo detector according to claim 1, wherein the sensitivity adjustment terminal is configured to apply a voltage higher than or equal to a set voltage to the light-absorbing part so as to reset the light-absorbing part.

6. A unit pixel of an image sensor, comprising:
a photo detector configured to generate a flow of electric current using a change in a quantity of electric charges by incident light; and
a select device configured to output an electric current generated in the photo detector to a unit pixel output terminal,
wherein the photo detector includes a light-absorbing part configured to absorb light, a source and a drain which are separated from the light-absorbing part by an oxide film, a channel which is formed between the source and the drain to generate a flow of electric current between the source and the drain, and a sensitivity adjustment terminal configured to apply an external voltage to the light-absorbing part and a P-well or N-well of the sensitivity adjustment terminal is connected to a drain of a reset device, wherein the photo detector is configured to adjust the flow of electric current in the channel based on the change in the quantity of electric charges in the light-absorbing part according to tunneling of an electron excited by light incident to the light-absorbing part to the source or the drain, and wherein the photo detector is configured to adjust the external voltage, wherein when the external voltage is adjusted, a gap between a Fermi level and an intrinsic level of the channel is adjusted, and the threshold voltage is adjusted, wherein, when an absolute value of the external voltage is adjusted to be higher than the absolute value of a set voltage, the light-absorbing part has a first potential state and no current flows through the channel, wherein, when the absolute value of the external voltage is adjusted to be equal to the absolute value of the set voltage, light-absorbing part has a second potential state, so that and when the light is incident on the light-absorbing part, the current flows through the channel, wherein, when the absolute value of the external voltage is adjusted to be 0V to reduce dark electric current, the light-absorbing part has a third potential state and the current always flows through the channel, and wherein the value of set voltage when light is suddenly incident to the light-absorbing part is higher than the value of the set voltage so as to prevent the image saturation in the photo detector in advance, and wherein the drain of the reset device is connected to a P-well or N-well body of the photo detector, and a bias voltage for reset is applied to a source of the reset device, and where all remaining electric charges in the floated N-well are eliminated before operating the photo detector to suppress generation of dark electric current due to the remaining electric charges.

7. The unit pixel of the image sensor according to claim 6, wherein the select device includes a drain and a source which are connected to the photo detector and a unit pixel output terminal, respectively, and a gate to which a select signal is capable of being externally applied, and performs a switching operation based on the applied select signal.

8. The unit pixel of the image sensor according to claim 6, wherein the source of the photo detector and the drain of the select device are formed on the same active area.

9. The unit pixel of the image sensor according to claim 6, wherein the photo detector is configured to adjust the voltage applied to the sensitivity adjustment terminal based on an amount of the incident light so as to suppress image saturation due to a sudden increase in an amount of photoelectric current.

10. A unit pixel of an image sensor, comprising:
a photo detector configured to generate a flow of electric current using a change in a quantity of electric charges by incident light;
as select device configured to output the electric current generated in the photo detector to a unit pixel output terminal; and
a reset device configured to eliminate a remaining electric charge in the photo detector,
wherein the photo detector includes a light-absorbing part configured to absorb light, a source and a drain that are separated from the light-absorbing part by an oxide film, a channel that is formed between the source and the drain and configured to generate the flow of electric current between the source and the drain, and a sensitivity adjustment terminal configured to apply an external voltage to the light-absorbing part and a P-well or N-well of the sensitivity adjustment terminal is connected to a drain of a reset device, wherein the photo detector is configured to control the flow of electric current based on the change in the quantity of electric charges in the light-absorbing part according to tunneling of an electron excited by the light incident to the light-absorbing part to the source or the drain, and wherein the photo detector is configured to adjust the external voltage, wherein when the external voltage is adjusted, a gap between a Fermi level and an intrinsic level of the channel is adjusted, and the threshold voltage is adjusted, wherein, when an absolute value of the external voltage is adjusted to be higher than the absolute value of a set voltage, the light-absorbing part is has a first potential state and no current flows through the channel, wherein, when the absolute value of the external voltage is adjusted to be equal to the absolute value of the set voltage, light-absorbing part is has a second potential state, and when the light is incident on the light-absorbing part, the current flows through the channel, wherein, when the absolute value of the external voltage is adjusted to be 0V to reduce dark electric current, the light-absorbing part has a third potential state and the current always flows through the channel, and wherein the value of set voltage when light is suddenly incident to the light-absorbing part is higher than the value of the set voltage so as to prevent the image saturation in the photo detector in advance, and wherein the drain of the reset device is connected to a P-well or N-well body of the photo detector, and a bias voltage for reset is applied to a source of the reset device, and where all remaining electric charges in the floated N-well are eliminated before operating the photo detector to suppress generation of dark electric current due to the remaining electric charges.

11. The unit pixel of the image sensor according to claim 10, wherein the reset device is configured to eliminate the remaining electric charge in a diffusion well on which the photo detector is formed.

12. The unit pixel of the image sensor according to claim 11, wherein the diffusion well is maintained in a floating state during an operation of the photo detector.

13. The unit pixel of the image sensor according to claim 10, wherein the photo detector is configured to apply a voltage higher than or equal to a set voltage through the sensitivity adjustment terminal to increase the threshold voltage of the channel, to thereby reset the unit pixel.

* * * * *